(12) United States Patent
Moon et al.

(10) Patent No.: US 6,724,425 B1
(45) Date of Patent: Apr. 20, 2004

(54) SOLID STATE IMAGE SENSOR AND METHOD FOR FABRICATING THE SAME

(75) Inventors: Sang Ho Moon, Seoul (KR); In Kyou Choi, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 880 days.

(21) Appl. No.: 09/596,270

(22) Filed: Jun. 16, 2000

(30) Foreign Application Priority Data

Jul. 14, 1999 (KR) ........................................ 1999-28468

(51) Int. Cl.⁷ .............................................. H04N 5/335
(52) U.S. Cl. ........................ 348/272; 348/311; 348/340
(58) Field of Search ........................... 348/207.99, 272, 348/273, 274, 275, 281, 294, 311, 315, 340; 438/7, 24, 27, 31, 70; 257/232, 233, 225, 215; 250/208.1

(56) References Cited

U.S. PATENT DOCUMENTS

| | | | |
|---|---|---|---|
| 5,514,888 A | * | 5/1996 | Sano et al. .................. 257/232 |
| 5,716,867 A | | 2/1998 | Kim |
| 5,818,052 A | | 10/1998 | Elabd |
| 5,828,091 A | | 10/1998 | Kawai |
| 5,874,993 A | | 2/1999 | Ciccarelli et al. |
| 5,907,355 A | | 5/1999 | Kotaki |
| 6,198,507 B1 | * | 3/2001 | Ishigami ...................... 348/273 |
| 6,395,576 B1 | * | 5/2002 | Chang et al. .................. 438/70 |
| 6,618,087 B1 | * | 9/2003 | Hokari et al. ................ 348/311 |

* cited by examiner

Primary Examiner—Tuan Ho
(74) Attorney, Agent, or Firm—Morgan, Lewis & Bockius LLP

(57) ABSTRACT

Solid state image sensor suitable for enhancing sensitivity of charge coupled devices (CCDs) using phase shift of light, and method for fabricating the same, the solid state image sensor including a plurality of photodiodes for generating image charges from incident lights, a plurality of charge coupled devices provided between the photodiodes for transmitting the image charges in one direction, a first flat layer formed on an entire surface of the photodiodes and the charge coupled devices, a plurality of color filter layers formed on the first flat layer to be in correspondence to the photodiodes, a plurality of black layers formed on the first flat layer between the color filter layers, a plurality of phase shift layers selectively formed on the color filter layers to be in correspondence to the photodiodes alternately, a second flat layer formed on an entire surface including the phase shift layers, and a plurality of microlenses formed on the second flat layer to be in correspondence to the photodiodes.

26 Claims, 12 Drawing Sheets

SOLID STATE IMAGE SENSOR AND METHOD FOR FABRICATING THE SAME

BACKGROUND OF THE INVENTION

1. Field of the Invention

The present invention relates to a solid state image sensor and, more particularly to, a solid state image sensor suitable for enhancing sensitivity of charge coupled devices (CCDs) using phase shift of light, and a method for fabricating the same.

2. Background of the Related Art

In general, a solid state image sensor refers to a device for image sensing an object and converting the image to electrical signals using photoelectric conversion elements and charge coupled elements.

The charge coupled elements are used to transmit signal charges generated in the photoelectric conversion elements (i.e., photodiodes) passed through a color filter layer in a specified direction through a microlens using variations of electric potential in a substrate.

The solid state image sensor includes a plurality of photodiodes (PDs), vertical CCDs each provided between the PDs for transmitting charges generated from the PDs in the vertical direction, horizontal CCDs for transmitting the charges vertically transmitted by the vertical CCD in the horizontal direction, and floating diffusion devices for sensing and amplifying the horizontally transmitted charges and outputting the amplified charges to the peripheral circuits.

A related art method for fabricating a solid state image sensor will be described with reference to the attached drawings. FIGS. 1a–1d illustrate sections showing the steps of a related art method for fabricating a solid state image sensor.

As shown in FIG. 1a, a first flat layer 14 is formed on a black-and-white solid state image sensor 11, which is provided with a plurality of PDs 12 for converting image signals of light to electrical signals, vertical CCDs 13 for transmitting image charges generated in the PDs 12 in the vertical direction, and horizontal CCDs (not shown) for transmitting the vertically transmitted image charges in the horizontal direction.

As shown in FIG. 1b, first to third color filter layers 15, 16 and 17 are selectively formed on the first flat layer 14 in succession to be in correspondence to the PDs 12 on a one-to-one basis. The color filter layers are formed by coating and patterning a colorable resist and then dying and fixing the patterned colorable resist layer.

As shown in FIG. 1c, a second flat layer 18 is formed on en entire surface including the first to third color filter layers 15, 16 and 17.

And, as shown in FIG. 1d, a plurality of microlenses 19 are formed on the second flat layer 18 to be in correspondence to the PDs 12 on a one-to-one basis.

The operation of the related art solid state image sensor as fabricated above will be described.

The light incident to the solid state image sensor is focused by the microlenses 19, passes through the first to third color filter layers 15, 16 and 17 each of which passes a light of a particular wavelength, and is incident to the PDs 12 on a one-to-one basis.

The light incident to the PDs 12 is converted to an electrical signal and transmitted in the vertical and horizontal directions according to clock signals applied to the gates on the vertical and horizontal PDs of the solid state image sensor. The electrical signals are then sensed and amplified by the floating diffusion device (not shown) at the end of the horizontal PD and transmitted to the peripheral circuits.

The above-stated related art method for fabricating a solid state image sensor, however, involves many problems as follows:

First, spherical surface control of the microlenses is difficult, and dependent on process parameters.

Second, as a contact depth of the PDs becomes greater, a depth of focus cannot be made greater in focusing.

Third, the microlenses formed of a transparent resinous material is susceptible to deformation, and has a low thermal resistance to cause irregular reflection of light.

SUMMARY OF THE INVENTION

It is, therefore, an object of the present invention to provide a solid state image sensor and its fabricating method designed to increase a depth of focus using phase shift of light and prevent irregular reflection of light, thereby enhancing focusing efficiency and hence sensitivity.

To achieve the object of the present invention, there is provided a solid state image sensor including a plurality of photodiodes for generating image charges from incident lights, a plurality of charge coupled devices provided between the photodiodes for transmitting the image charges in one direction, a first flat layer formed on an entire surface of the photodiodes and the charge coupled devices, a plurality of color filter layers formed on the first flat layer to be in correspondence to the photodiodes, a plurality of black layers formed on the first flat layer between the color filter layers, a plurality of phase shift layers selectively formed on the color filter layers to be in correspondence to the photodiodes alternately, a second flat layer formed on an entire surface including the phase shift layers, and a plurality of microlenses formed on the second flat layer to be in correspondence to the photodiodes.

In accordance with another aspect of the present invention, there is provided a method for fabricating a solid state image sensor, comprising the steps of forming a plurality of photodiodes for generating image charges from incident lights, forming a plurality of charge coupled devices between the photodiodes for transmitting the image charges in one direction, forming a first flat layer on an entire surface of the photodiodes and the charge coupled devices, selectively forming a plurality of color filter layers on the first flat layer to be in correspondence to the photodiodes, forming a plurality of black layers on the first flat layer between the color filter layers, selectively forming a plurality of phase shift layers on the color filter layers to be in correspondence to the photodiodes alternately, forming a second flat layer on an entire surface including the phase shift layers, and forming a plurality of microlenses on the second flat layer to be in correspondence to the photodiodes.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIG. 2b illustrates a cross-sectional view taken along the line II—II of FIG. 2a;

FIGS. 4b and 4c are cross-sectional views taken along the line II—II of FIG. 4a;

DETAILED DESCRIPTION OF PREFERRED EMBODIMENT

Hereinafter, a solid state image sensor and a method for fabricating the same according to the present invention will be described in detail with reference to the accompanying drawings.

Figure 1A:
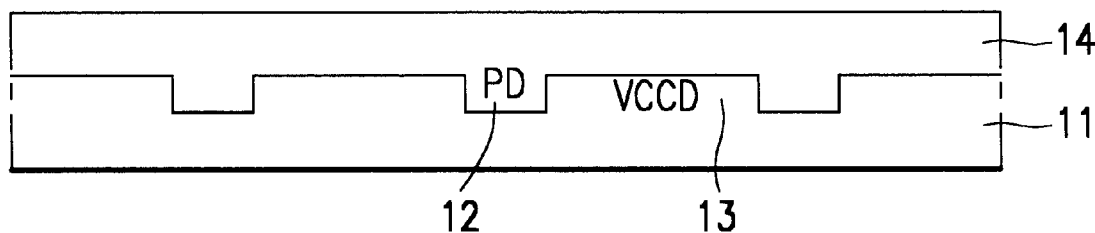
FIGS. 1a–1d illustrate sections showing the steps of a related art method for fabricating a solid state image sensor.
Figure 1B:
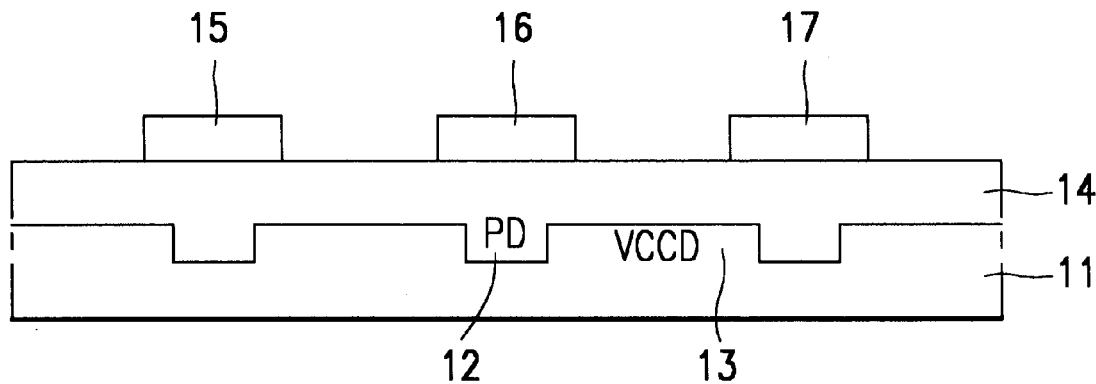
Figure 1C:
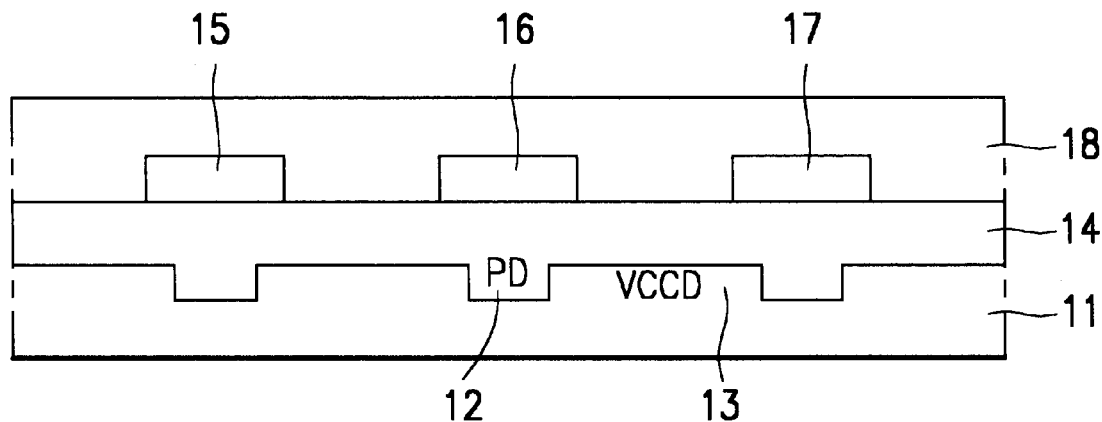
Figure 1D:
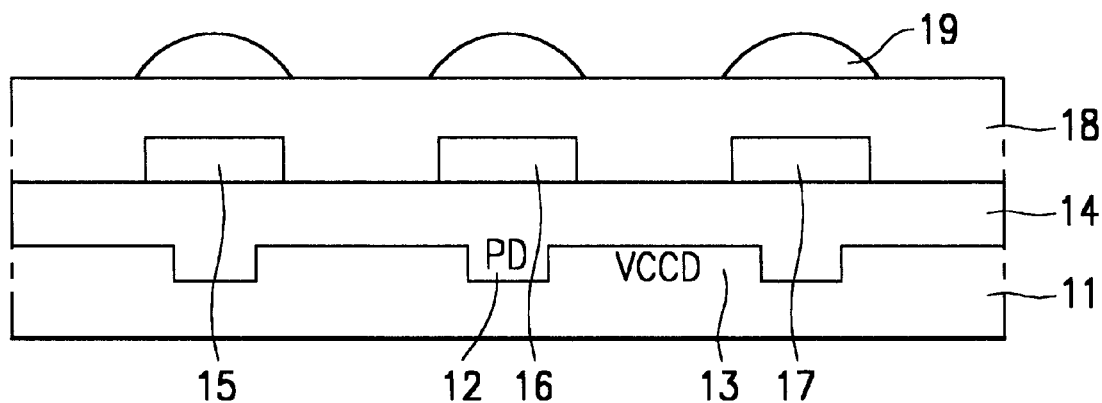
Figure 2A:
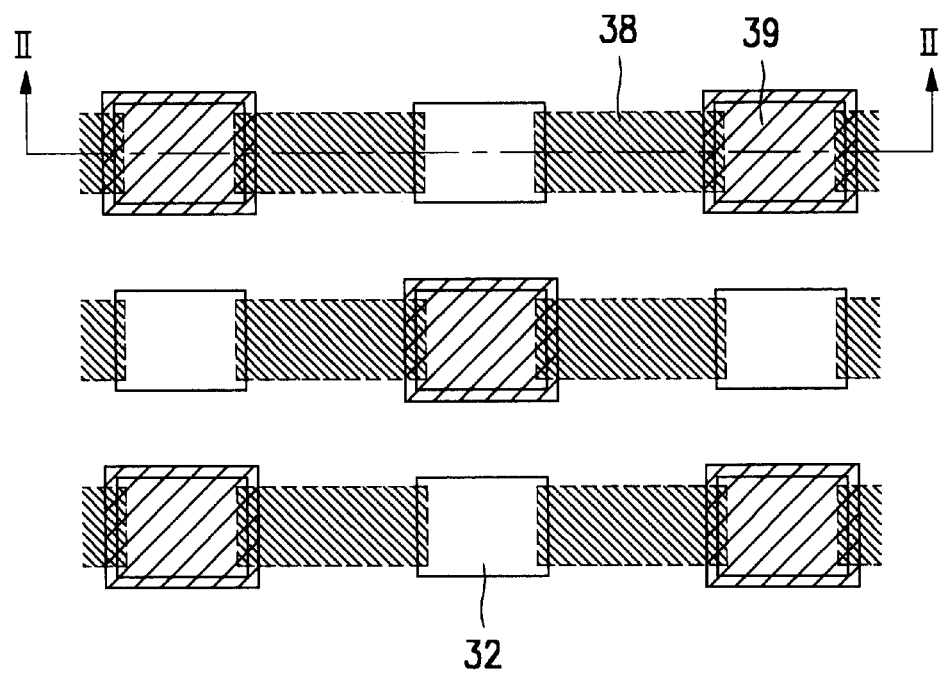
FIG. 2a illustrates a plan view of a solid state image sensor according to a first preferred embodiment of the present invention.
Figure 2B:
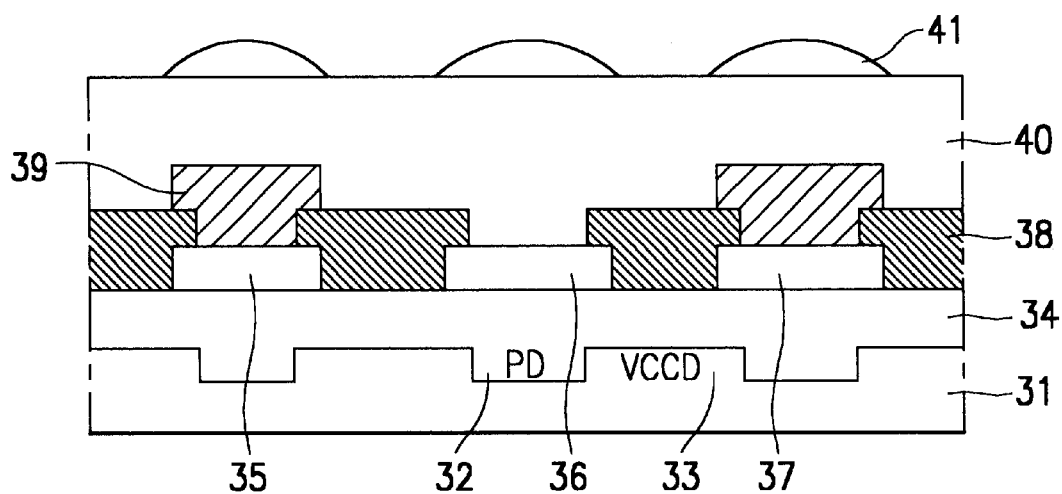

FIG. 2a is a plan view of a solid state image sensor according to a first embodiment of the present invention and FIG. 2b is a cross-sectional view taken along the line II—II of FIG. 2a.

As illustrated in FIGS. 2a and 2b, the solid state image sensor according to a first embodiment of the present invention includes a first flat layer 34 formed on a black-and-white solid state image sensor 31, which includes a plurality of PDs 32 arranged in a matrix for converting image signals of light to electrical signals, vertical CCDs 33 for transmitting image charges generated in the PDs 32 in the vertical direction, and a horizontal CCD (not shown) for transmitting the vertically transmitted image charges in the horizontal direction, first to third color filter layers 35, 36 and 37 formed on the first flat layer 34 to be in correspondence to the PDs 32 on a one-to-one basis, a plurality of black layers 38 of a chrome (Cr) film or a titanium nitride (TiN) film on the first flat layer 34 between the first to third color filter layers 35, 36 and 37. There are phase shift layers 39 selectively on the first to third color filter layers 35 and 37 to be in correspondence to the PDs 32 on a one-to-one basis, alternately. There are a second flat layer 40 on an entire surface including the phase shift layers 39, and there are microlenses 41 on the second flat layer 40 to be in correspondence to the PDs 31 on a one-to-one basis. There is a light-shielding layer (not shown) between the PDs 32.

FIGS. 3a–3e illustrate cross-sectional views showing the steps of a method for fabricating the solid state image sensor according to the first embodiment of the present invention.

Figure 3A:
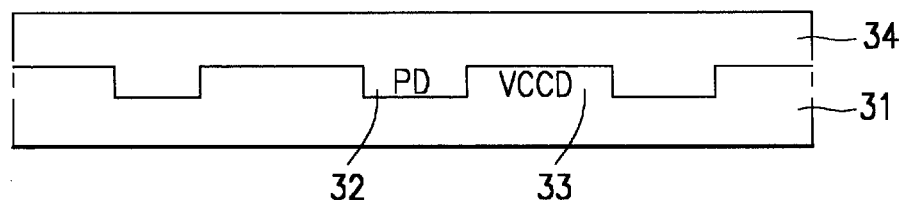
FIGS. 3a–3e illustrate sections showing the steps of a method for fabricating a solid state image sensor in accordance with a first preferred embodiment of the present invention.

As shown in FIG. 3a, a first flat layer 34 is formed on a black-and-white solid state image sensor 31, which includes a plurality of PDs 32 for converting image signals of light to electrical signals, vertical CCDs 33 for transmitting image charges generated in the PDs 32 in a vertical direction, and a horizontal CCD (not shown) for transmitting the vertically transmitted image charges in a horizontal direction.

Figure 3B:
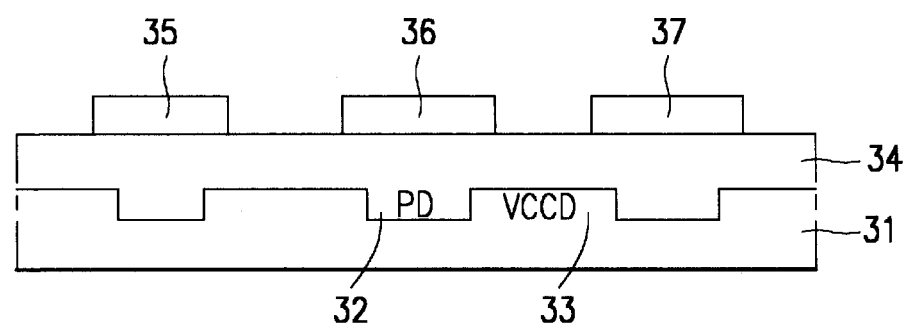

As shown in FIG. 3b, first to third color filter layers 35, 36 and 37 are selectively formed on the first flat layer 34 in succession to be in correspondence to the PDs 32 on a one-to-one basis. The color filter layers are formed by coating and patterning a colorable resist and then dying and fixing the patterned colorable resist.

Figure 3C:
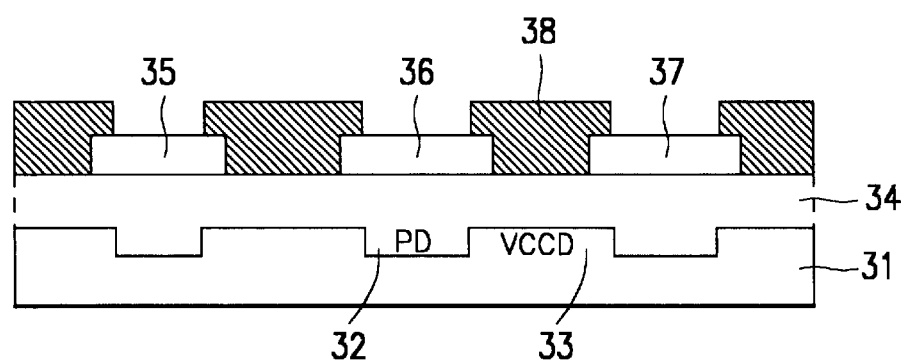

As shown in FIG. 3c, black layers 38 are formed on an entire surface including the first to third color filter layers 36, 36 and 37 and then selectively removed to leave the black layer 38 only on the first flat layer 34 between the first to third color filter layers 35, 36 and 37. The black layers 38 between the first to third color filter layers 35, 36 and 37 have portions thereof overlying the color filter layers, respectively. The black layers 38 are formed of titanium nitride TiN or chrome Cr.

Figure 3D:
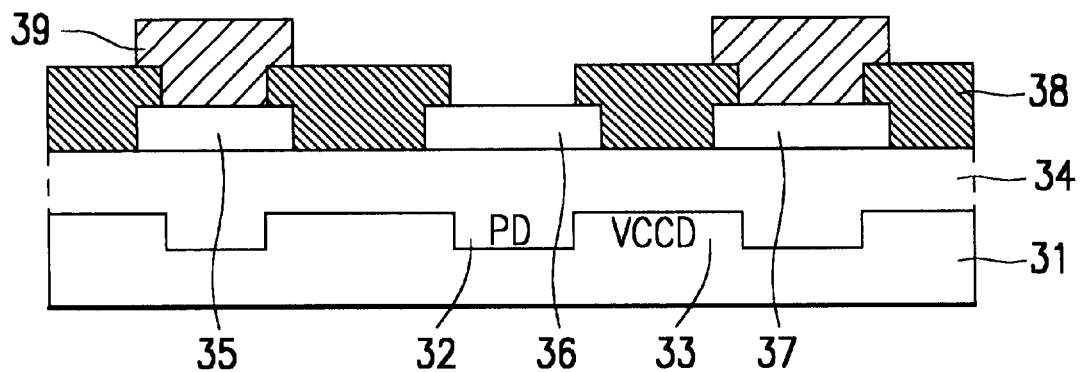

As shown in FIG. 3d, a phase shifting material layer is formed on an entire surface including the black layers 38 and then selectively removed to be in correspondence to the PDs 32 alternately, i.e., to be left only on the first and third color filter layers 35 and 37, thereby forming the phase shift layer 39. The phase shift layer 39 formed on the first and third color filter layers 35 and 37 to be in correspondence to the PDs 32 alternately has a portion thereof overlying the neighboring black layers 38.

Figure 3E:
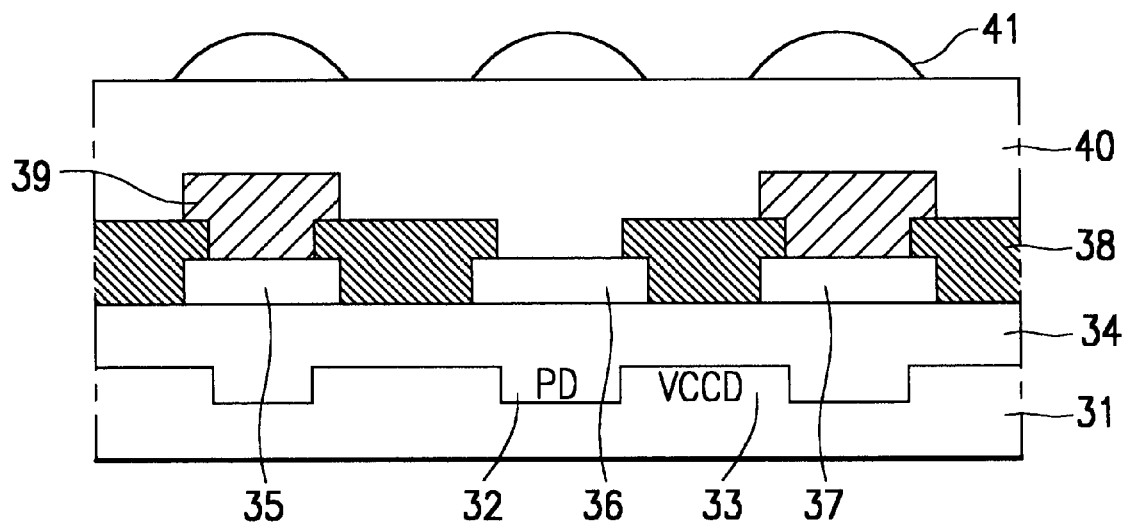

As shown in FIG. 3e, the second flat layer 40 is formed on an entire surface including the phase shift layer 39, which is formed in correspondence to the PDs 32, alternately. The microlenses 41 are formed on the second flat layer 40 to be in correspondence to the PDs 32 on a one-to-one basis.

In the solid state image sensor thus fabricated, a light incident to the microlenses 41 is focused and directed to the PDs 32. The focused light is converted to electrical signals at the microlenses 41 and transmitted in the vertical and horizontal directions according to clock signals applied to the gates on the vertical and horizontal PDs. The electrical signals are then sensed and amplified in the floating diffusion region (not shown) at the end of the horizontal PD and transmitted to peripheral circuits.

The phase shift layer 39 formed on the first and third color filter layers 35 and 37 to be in correspondence to the PDs 32 alternately shifts the phase of light by 180 degrees, thus increasing the depth of focus and focusing efficiency and improving the sensitivity.

Figure 4A:
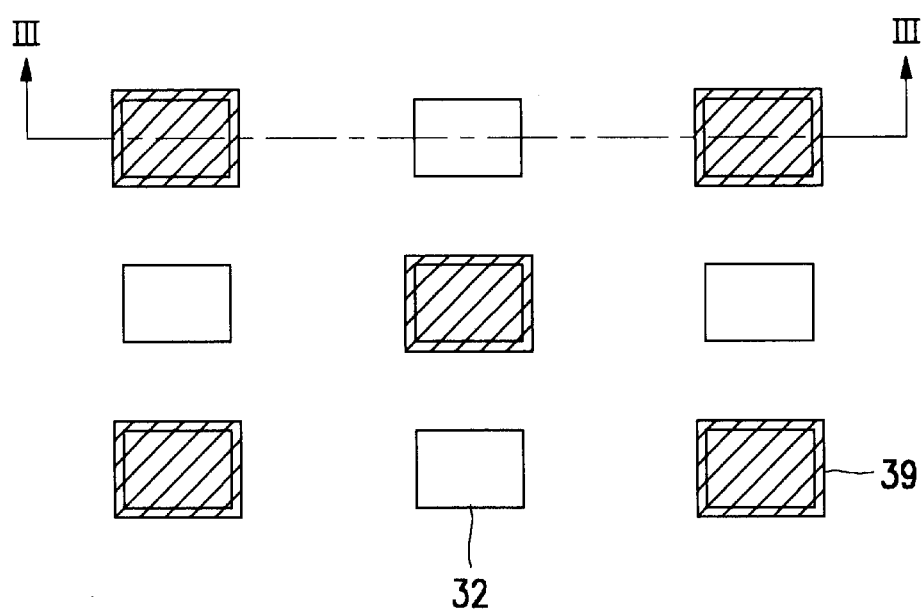
FIG. 4a illustrates a plan view of a solid state image sensor according to a second embodiment of the present invention.
Figure 4B:
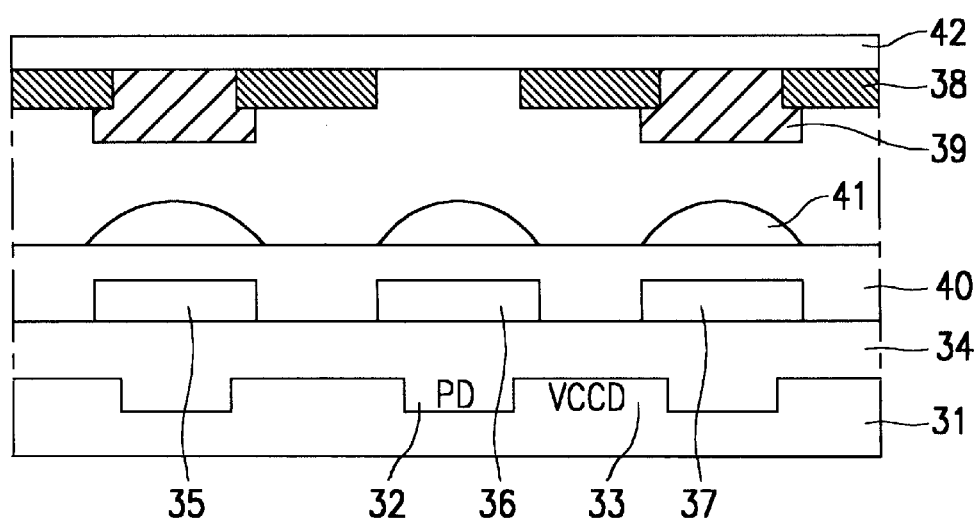
Figure 4C:
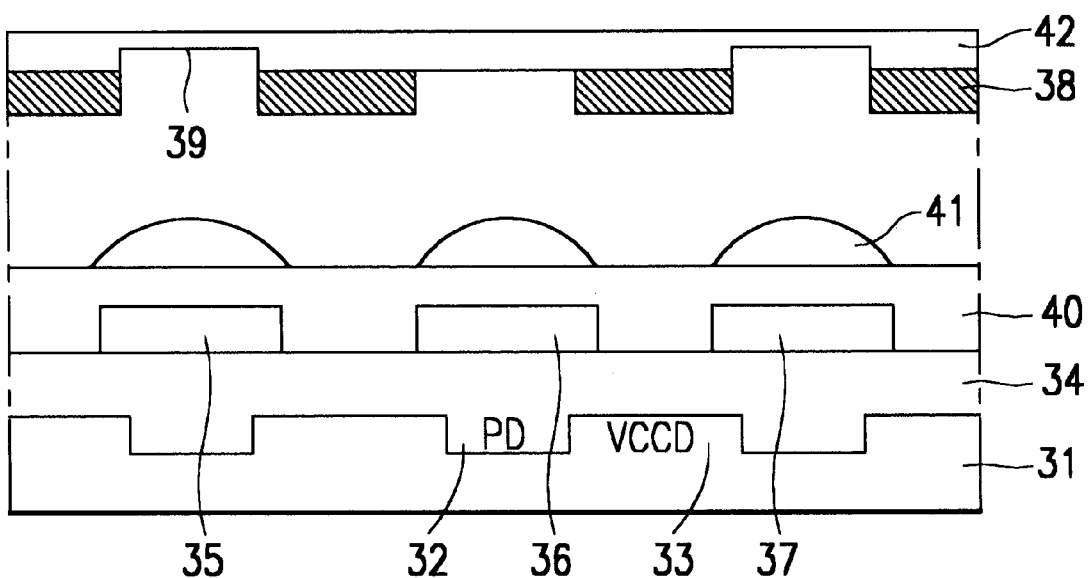

FIG. 4a is a plan view of a solid state image sensor in accordance with a second preferred embodiment of the present invention, and FIGS. 4b and 4c are cross-sectional views taken along the line III—III of FIG. 4a.

As illustrated in FIGS. 4a and 4b, the solid state image sensor in accordance with a second preferred embodiment of the present invention includes a first flat layer 34 formed on a black-and-white solid state image sensor 31, which includes a plurality of PDs 32 arranged at fixed intervals in a matrix for converting image signals of light to electrical signals, vertical CCDs 33 for transmitting image charges generated in the PDs 32 in the vertical direction, and horizontal CCDs (not shown) for transmitting the vertically transmitted image charges in the horizontal direction, first to third color filter layers 35, 36 and 37 formed on the first flat layer 34 to be in correspondence to the PDs 32 on a one-to-one basis, a second flat layer 40 formed on an entire surface including the first to third color filter layers 35, 36 and 37. There are a plurality of microlenses 41 formed on the second flat layer 40 to be in correspondence to the PDs 32, and a plurality of black layers 38 formed at fixed intervals on a bottom of a glass layer 42 correspondingly between the microlenses 41. The microlenses 41 are also formed on the bottom of the glass layer 42 of the package. There are a plurality of phase shift layers 39 of a phase shifting material selectively formed on the bottom of the glass layer 42 to be in correspondence to the PDs 32, alternately. The phase shift layers 39 have portions thereof overlying the neighboring black layers 38.

As shown in FIG. 4c, the phase shift layers 39 can also be formed as trenches having a predetermined depth on the bottom of the glass layer 42, i.e., in the surface of the glass layer 42 between the black layers 38.

FIGS. 5a–5d are cross-sectional views illustrating the steps of a method for fabricating the solid state image sensor according to the second embodiment of the present invention.

Figure 5A:
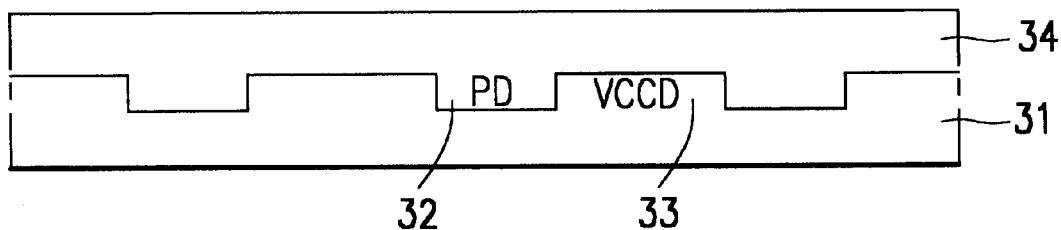
FIGS. 5a–5d illustrate cross-sectional views showing the steps of a method for fabricating a solid state image sensor according to the second embodiment of the present invention.

As shown in FIG. 5a, the first flat layer 34 is formed on the black-and-white solid state image sensor 31, which includes a plurality of PDs 32 for converting image signals of light to electrical signals, vertical CCDs 33 for transmitting image charges generated in the PDs 32 in a vertical direction, and a horizontal CCD (not shown) for transmitting the vertically transmitted image charges in the horizontal direction.

Figure 5B:
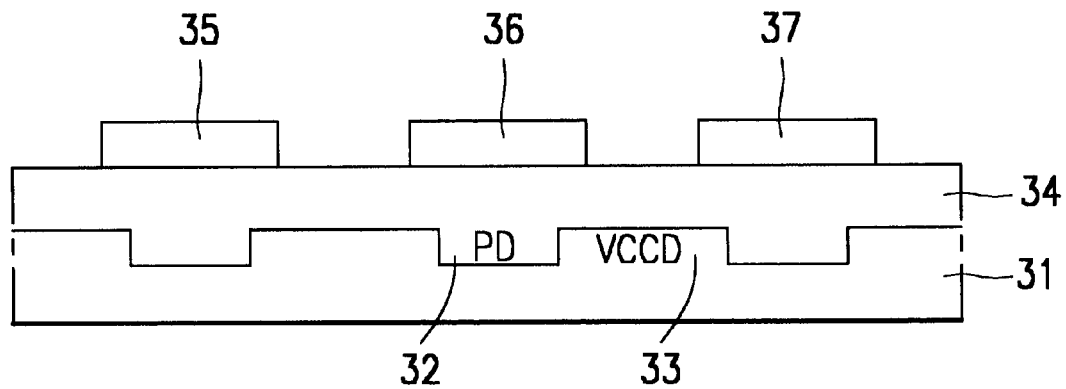

As shown in FIG. 5b, first to third color filter layers 35, 36 and 37 are selectively formed on the first flat layer 34 in succession to be in correspondence to the PDs 32 on a one-to-one basis. The color filter layers are formed by coating and patterning a colorable resist and then dying and fixing the patterned colorable resist.

Figure 5C:
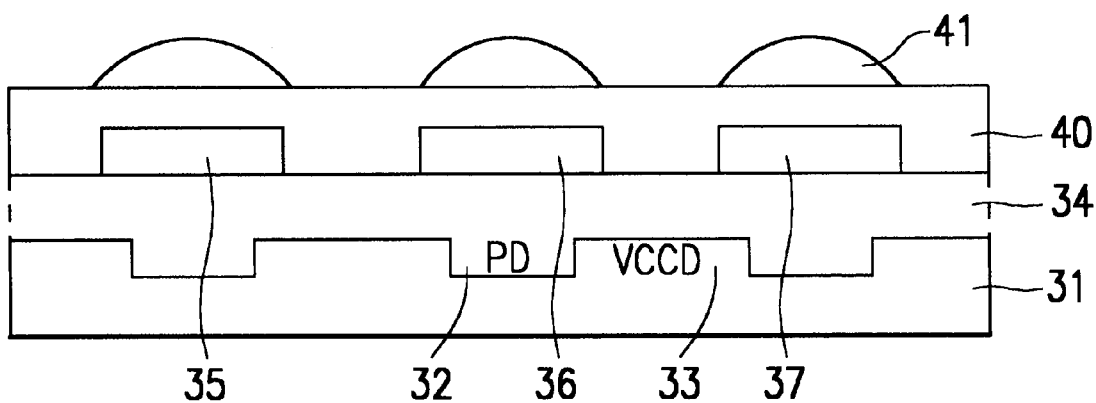

As shown in FIG. 5c, a second flat layer 40 is formed on an entire surface including the first to third color filter layers 35, 36 and 37, and microlenses 41 are formed on the second flat layer 40 to be in correspondence to the PDs 32 on a one-to-one basis.

Figure 5D:
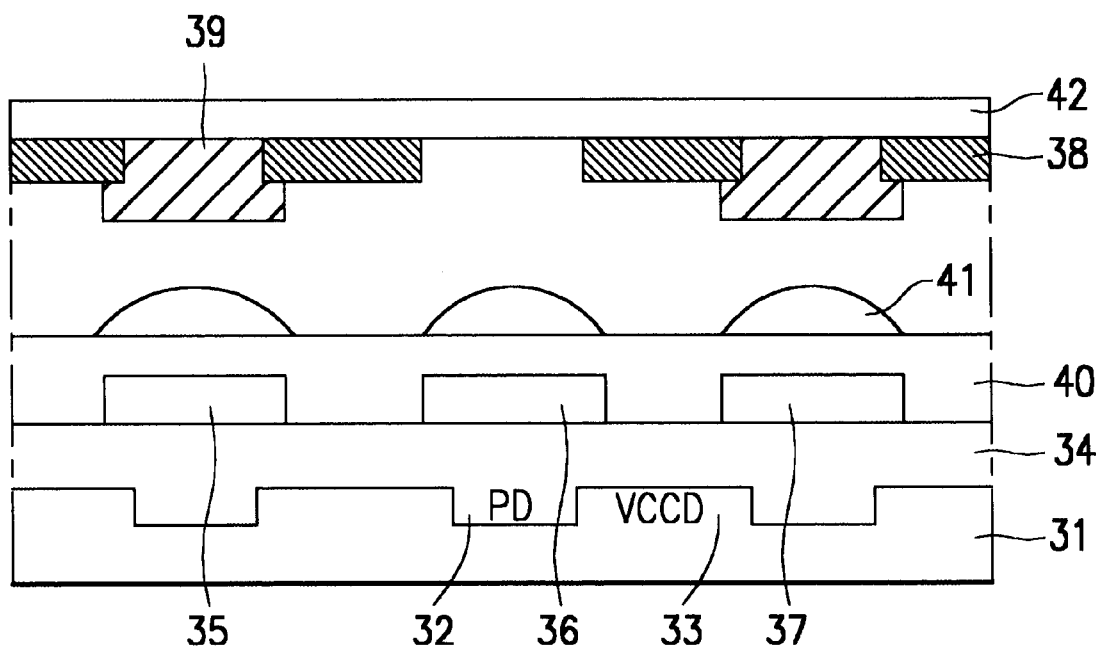

As shown in FIG. 5d, a plurality of black layers 38 are formed at fixed intervals on a bottom of a glass layer 42 of the package to be in correspondence to portions between the microlenses 41. Then, a phase shifting material layer is formed on an entire surface of bottom of the glass layer 42 including the black layers 38 and selectively removed to leave the layer only on the bottom of the glass layer 42 alternately in correspondence to the PDs 32, thereby forming the phase shift layers 39. The phase shift layers 39 have portions thereof overlying the neighboring black layers 38. The black layers 38 is formed of a chrome or a titanium nitride. Alternatively, the phase shift layers 39 may be formed by forming a plurality of trenches having a predetermined depth in the bottom surface of the glass layer 42, as illustrated in FIG. 4c.

Figure 6:
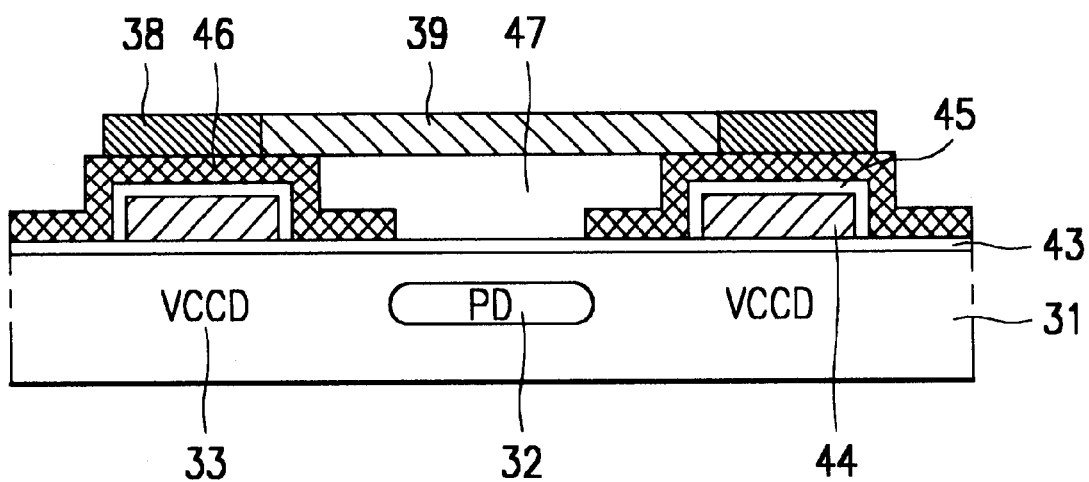
FIG. 6 is a cross-sectional view of a solid state image sensor according to a third embodiment of the present invention.

FIG. 6 is a cross-sectional view of a solid state image sensor according to a third embodiment of the present invention.

As illustrated in FIG. 6, the solid state image sensor according to a third embodiment of the present invention includes a black-and-white solid state image sensor 31, which includes a plurality of PDs 32 arranged at fixed intervals in a matrix for converting image signals of light to electrical signals, vertical CCDs 33 for transmitting image charges generated in the PDs 32 in a vertical direction, and a horizontal CCD (not shown) for transmitting the vertically transmitted image charges in the horizontal direction. There is a gate insulating layer 43 formed on the black-to-white solid state image sensor 31 and a transfer gate 44 formed on the gate insulating layer 43 on the top of the vertical CCDs 33 for changing the potential of the transfer gate 44 according to clock signals. And, there is a metallic shielding layer 46 formed to surround the transfer gate 44 for preventing infiltration of lights into regions other than the PDs 32. There is a passivation layer 47 formed as high as the surface of the metallic shielding layer 46 over the PDs 32, and a phase shift layer 39 formed on the passivation layer 47. There are black layers 38 of titanium nitride or chrome at both sides of the phase shifting layer 39. Here, the phase shift layer 39 has a portion thereof overlying the passivation layer 46 and its neighboring metallic shielding layer 46.

The phase shift layer 39 is formed to have a thickness "d" of $\lambda/2(n-1)$ for substituting the microlenses, where 'n' denotes a refraction index of the phase shift layer.

FIGS. 7a–7d are cross-sectional views illustrating the steps of a method for fabricating the solid state image sensor according to the third embodiment of the present invention.

Figure 7A:
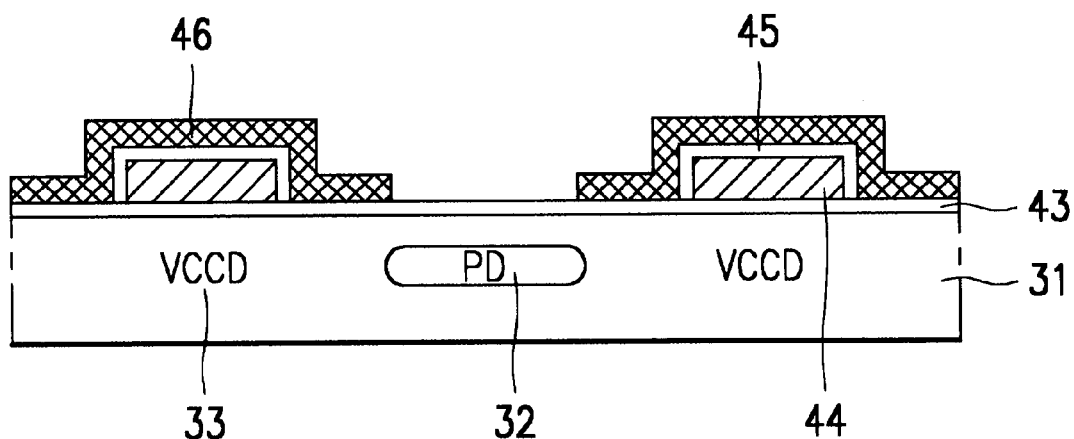
FIGS. 7a–7d illustrate cross-sectional views showing the steps of a method for fabricating a solid state image sensor according to the third embodiment of the present invention.

As shown in FIG. 7a, a black-and-white solid state image sensor 31 is formed, which includes the plurality of PDs 32 for converting image signals of light to electrical signals, vertical CCDs 33 for transmitting image charges generated in the PDs 32 in a vertical direction, and a horizontal CCDs (not shown) for transmitting the vertically transmitted image charges in the horizontal direction. Then, a gate insulating layer 43 is formed on an entire surface of the black-and-white solid state image sensor 31. After formation of a polysilicon layer on the gate insulating layer 43, the gate insulating layer 43 is selectively patterned to leave the gate insulating layer 43 only on the vertical CCDs 33, to form a transfer gate 44 for changing potential of the vertical CCDs 33 according to clock signals.

An interlayer insulating layer 45 is formed on an entire surface of the transfer gate 44. A metal layer is formed on an entire surface including the interlayer insulating layer 45 and then selectively patterned to leave the metal layer only on a portion surrounding the transfer gate 44, to form a metallic shielding layer 46 for preventing infiltration of lights into portions other than the Pds 32. In this instance, though the transfer gate 44 is illustrated as a unit gate in the drawing, the transfer gate is formed by stacking a first and a second polygates.

Figure 7B:
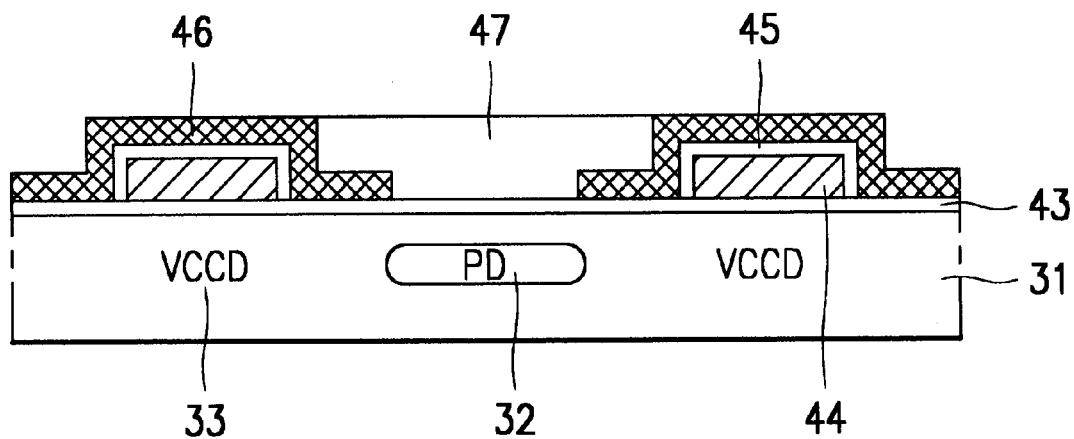

As shown in FIG. 7b, a passivation layer 47 is formed on an entire surface including the metallic shielding layer 46 and subjected to planarization to leave only on top of the PDs 32. The passivation layer 47 is formed of a nitride to be as high as a top surface of the metallic shielding layer 46.

Figure 7C:
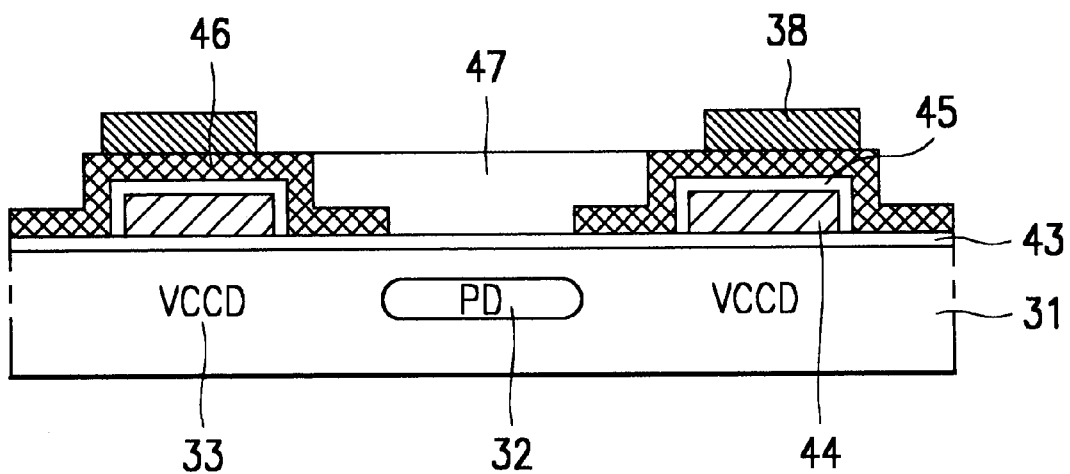

As shown in FIG. 7c, black layers 38 of titanium nitride (TiN) or chrome are formed on an entire surface including the passivation layer 47 and then patterned to leave the black layers 38 only on the vertical CCDs 33 between the PDs 32.

Figure 7D:
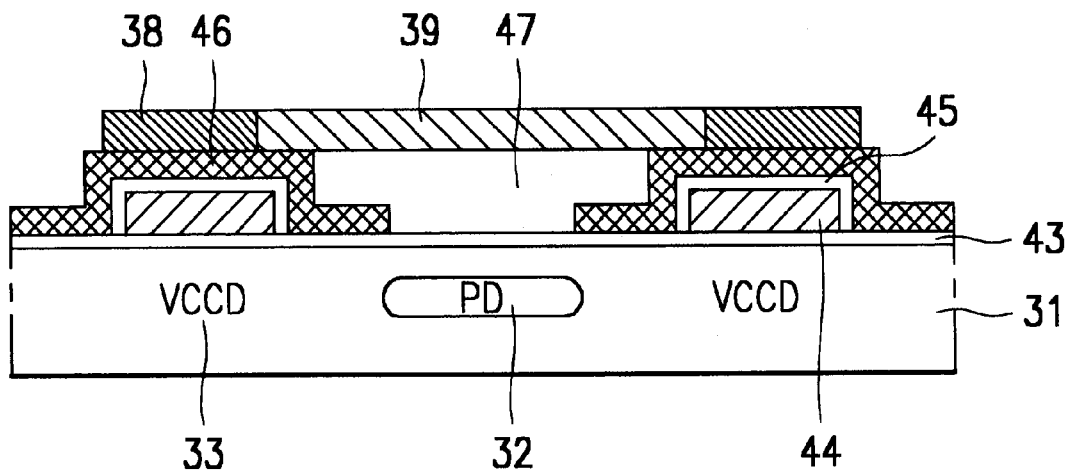

As shown in FIG. 7d, a phase shifting material layer is formed on an entire surface including the black layers 38, and selectively removed by a photolithography and photo etching, to form the phase shift layer 39 only on the passivation layer 47, i.e., on the PDs 32. The phase shift layer 39 has a portion thereof overlying the passivation layer 47 and its neighboring metallic shielding layer 46. The phase shift layer 39 has a thickness "d" of $\lambda/2(n-1)$ for substituting the microlenses, where 'n' is a refraction index of the phase shift layer.

As described above, the present invention solid state image sensor and its fabricating method presents the following advantages:

First, the formation of phase shift layer permits to use phase shift of light in increasing a focus depth, that enhance a sensitivity of the solid state image sensor.

Second, the prevention of irregular reflection of light improves a focusing efficiency and, hence, a sensitivity of the solid state image sensor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A solid state image sensor, comprising:
    a plurality of photodiodes for generating image charges from incident lights;
    a plurality of charge coupled devices provided between the photodiodes for transmitting the image charges in one direction;
    a first flat layer formed on an entire surface of the photodiodes and the charge coupled devices;
    a plurality of color filter layers formed on the first flat layer to be in correspondence to the photodiodes;
    a plurality of black layers formed on the first flat layer between the color filter layers;
    a plurality of phase shift layers selectively formed on the color filter layers to be in correspondence to the photodiodes, alternately;
    a second flat layer formed on an entire surface including the phase shift layers; and,
    a plurality of microlenses formed on the second flat layer to be in correspondence to the photodiodes.

2. The solid state image sensor as claimed in claim 1, wherein the black layers are formed of titanium nitride (TiN) or chrome.

3. The solid state image sensor as claimed in claim 1, wherein the black layers have portions thereof overlying the color filter layers.

4. The solid state image sensor as claimed in claim 1, wherein the phase shift layers have portions thereof overlying the neighboring black layers.

5. A method for fabricating a solid state image sensor, comprising the steps of:
    forming a plurality of photodiodes for generating image charges from incident lights;
    forming a plurality of charge coupled devices between the photodiodes for transmitting the image charges in one direction;
    forming a first flat layer on an entire surface of the photodiodes and the charge coupled devices;
    selectively forming a plurality of color filter layers on the first flat layer to be in correspondence to the photodiodes;
    forming a plurality of black layers on the first flat layer between the color filter layers;
    selectively forming a plurality of phase shift layers on the color filter layers to be in correspondence to the photodiodes, alternately;
    forming a second flat layer on an entire surface including the phase shift layers; and,
    forming a plurality of microlenses on the second flat layer to be in correspondence to the photodiodes.

6. The method as claimed in claim 5, wherein the black layers are formed of titanium nitride (TiN) or chrome.

7. The method as claimed in claim 5, wherein the black layers have portion thereof overlying the color filter layers.

8. The method as claimed in claim 5, wherein the phase shift layers have portions thereof overlying the neighboring black layers.

9. A solid state image sensor, comprising:
    a plurality of photodiodes for generating image charges from incident lights:
    a plurality of charge coupled devices provided between the photodiodes for transmitting the image charges in one direction;
    a first flat layer formed on an entire surface of the photodiodes and the charge coupled devices;
    a plurality of color filter layers formed on the first flat layer to be in correspondence to the photodiodes;
    a second flat layer formed on an entire surface including the color filter layers;
    a plurality of microlenses formed on the second flat layer to be in correspondence to the photodiodes;
    a plurality of black layers formed at fixed intervals on a bottom of a glass layer to be in correspondence to the microlenses, wherein the microlenses are formed in the glass layer of a package; and,
    a plurality of phase shift layers formed on the bottom of the glass layer to be in correspondence to the photodiodes, alternately.

10. The solid state image sensor as claimed in claim 9, wherein the phase shift layers are phase shifting material layers or trenches having a predetermined depth in the bottom of the glass layer.

11. The solid state image sensor as claimed in claim 9, wherein the black layers are formed of titanium nitride (TiN) or chrome.

12. The solid state image sensor as claimed in claim 9, wherein the black layers have portions thereof overlying the neighboring black layers.

13. A method for fabricating a solid state image sensor, comprising the steps of:
    forming a plurality of photodiodes for generating image charges from incident lights;
    forming a plurality of charge coupled devices between the photodiodes for transmitting the image charges in one direction;
    forming a first flat layer on an entire surface of the photodiodes and the charge coupled devices;
    forming a plurality of color filter layers on the first flat layer to be in correspondence to the photodiodes on a one-to-one basis;
    forming a second flat layer on an entire surface including the color filter layers;
    forming a plurality of microlenses on the second flat layer to be in correspondence to the photodiodes;
    forming a plurality of black layers at fixed intervals on a bottom of a glass layer to be in correspondence to the microlenses, wherein the microlenses are formed in the glass layer of a package; and
    forming a plurality of phase shift layers on the bottom of the glass layer to be in correspondence to the photodiodes, alternately.

14. The method as claimed in claim 13, wherein the phase shift layers have portions thereof overlying the neighboring black layers.

15. The method as claimed in claim 13, wherein the phase shift layers are formed by selectively patterning a phase shifting material layer formed on an entire surface of a bottom of the glass layer.

16. The method as claimed in claim 13, wherein the phase shift layers are formed by providing trenches having a predetermined depth in the bottom surface of the glass layer.

17. A solid state image sensor, comprising:

a plurality of photodiodes for generating image charges from incident lights;

a plurality of charge coupled devices provided between the photodiodes for transmitting the image charges in one direction;

a gate insulating layer formed on an entire surface of the photodiodes and the charge coupled devices;

a transfer gate formed on the gate insulating layer over the charge coupled devices;

an interlayer insulating layer formed on a surface of the transfer gate;

a metallic shielding layer formed to surround the transfer gate;

a passivation layer formed on top of the photodiodes;

a plurality of phase shift layers formed to have a predetermined thickness on the passivation layer and its neighboring metallic shielding layer and to be in correspondence to the photodiodes; and, a plurality of black layers formed on the metallic shielding layer on both sides of the phase shift layers.

18. The solid state image sensor as claimed in claim 17, wherein the passivation layer is formed of nitride.

19. The solid state image sensor as claimed in claim 17, wherein the black layers are formed of chrome or titanium nitride(TiN).

20. The solid state image sensor as claimed in claim 17, wherein the phase shift layers have a thickness of $d=\lambda/2(n-1)$, where n represent a refraction index of the phase shift layers.

21. The solid state image sensor as claimed in claim 17, wherein the passivation layer is formed as high as a surface of the metallic shielding layer.

22. A method for fabricating a solid state image sensor, comprising the steps of:

forming a plurality of photodiodes for generating image charges from incident lights;

forming a plurality of charge coupled devices between the photodiodes for transmitting the image charges in one direction;

forming a gate insulating layer on an entire surface of the photodiodes and the vertical charge coupled devices;

forming a transfer gate on the gate insulating layer over the charge coupled devices;

forming an interlayer insulating layer on a surface of the transfer gate;

forming a metallic shielding layer formed to surround the transfer gate;

forming a passivation layer on top of the photodiodes;

forming a plurality of phase shift layers having a predetermined thickness on the passivation layer and its neighboring metallic shielding layer to be in correspondence to the photodiodes; and, forming a plurality of black layers on the metallic shielding layer on both sides of the phase shift layers.

23. The method as claimed in claim 22, wherein the passivation layer is a nitride film.

24. The method as claimed in claim 22, wherein the black layers are formed of chrome or titanium nitride(TiN).

25. The method as claimed in claim 22, wherein the phase shift layers have a thickness of $d=\lambda/2(n-1)$, wherein n represents refraction index of the phase shift layers.

26. The method as claimed in claim 22, wherein the passivation layer is formed by forming a nitride layer on an entire surface including the metallic shielding layer and then subjecting the nitride layer to planarization.

* * * * *